(12) United States Patent  (10) Patent No.: US 8,463,224 B2
Pickerd et al.  (45) Date of Patent: Jun. 11, 2013

(54) ARBITRARY MULTIBAND OVERLAY MIXER APPARATUS AND METHOD FOR BANDWIDTH MULTIPLICATION

(75) Inventors: John J. Pickerd, Hillsboro, OR (US); Kan Tan, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 13/271,923

(22) Filed: Oct. 12, 2011

(65) Prior Publication Data

US 2013/0093493 A1   Apr. 18, 2013

(51) Int. Cl.
*H94B 1/26* (2006.01)
(52) U.S. Cl.
USPC ........... 455/315; 455/316; 455/323; 455/326; 455/264
(58) Field of Classification Search
USPC ................ 455/63.11, 67.14, 130, 131, 189.1, 455/190.1, 207, 209, 226.1, 236.1, 264, 315, 455/316, 323, 326
See application file for complete search history.

(56) References Cited

U.S. PATENT DOCUMENTS

| | | | |
|---|---|---|---|
| 5,392,044 A | 2/1995 | Kotzin et al. | |
| 5,412,690 A | 5/1995 | Kotzin et al. | |
| 7,058,548 B2 | 6/2006 | Pupalaikis et al. | |
| 7,139,684 B2 | 11/2006 | Pupalaikis et al. | |
| 7,219,037 B2 | 5/2007 | Pupalaikis et al. | |
| 7,222,055 B2 | 5/2007 | Pupalaikis et al. | |
| 7,298,206 B2 | 11/2007 | Pickerd et al. | |
| 7,356,318 B2 * | 4/2008 | Sowlati ....................... | 455/168.1 |
| 7,373,281 B2 | 5/2008 | Pupalaikis et al. | |
| 7,474,972 B2 | 1/2009 | Pickerd et al. | |
| 7,519,513 B2 | 4/2009 | Pupalaikis et al. | |
| 7,653,514 B2 | 1/2010 | Pupalaikis et al. | |
| 7,711,510 B2 | 5/2010 | Pupalaikis | |
| 2003/0109242 A1 * | 6/2003 | Ohtaki ......................... | 455/335 |
| 2004/0128076 A1 | 7/2004 | Pupalaikis et al. | |
| 2008/0253470 A1 * | 10/2008 | Lee et al. ..................... | 375/260 |

OTHER PUBLICATIONS

A channelized Digital Ultrawideband Receiver, Won Namgoong, IEEE Transactions on Wireless Copmmunications, vol. 2, No. 3, May 2003.
Frequency-interleaving Technique for High-Speed A/D Conversion, G. Ding, Swiss Federal Institute of Technology. Guillaume. ding@epfl.ch K Azadet High Speed Communications VLSI Research Dept.; Agere Systems, Holmdel, NJ 07733, USA ka@agere.com.
Ultra-wideband Radar Receiver, George T Ruck, Electronic Systems Group Battelle Columbus Operations. SPIE vol. 1631 Ultra wideband Radar 1992.

* cited by examiner

*Primary Examiner* — Tuan Pham
(74) *Attorney, Agent, or Firm* — Marger Johnson & McCollom, PC; Thomas F. Lenihan

(57) ABSTRACT

An apparatus and method for splitting a wide band input signal and overlaying multiple frequency bands on each path associated with one or more digitizers. All frequencies from the split signal on each path can be fed to a mixer. The local oscillator of each mixer receives a sum of signals, which can each be set to any arbitrary frequency, as long as an associated matrix determinant of coefficients is non-zero. Each oscillator signal is multiplied by a coefficient, which can represent phase and magnitude, prior to summing the oscillator signals together. Each mixer mixes a combined signal with the input, thereby generating a set of multiple overlaid frequency bands. The digitized signals are processed to substantially reconstruct the original input signal. Thus, the wide band input signal is digitized using multiple individual digitizers. In particular, a system can support two wide band signals using four digitizers of narrower bandwidth.

10 Claims, 6 Drawing Sheets

ARBITRARY MULTIBAND OVERLAY MIXER APPARATUS AND METHOD FOR BANDWIDTH MULTIPLICATION

BACKGROUND

This disclosure relates to test and measurement instruments, and in particular, to an acquisition apparatus of a test and measurement instrument having an arbitrary multiband overlay mixer apparatus and associated techniques for bandwidth multiplication.

The performance of test and measurement instruments, including digital oscilloscopes, is limited by the input bandwidth of the acquisition system. Conventional components for acquiring high frequency signals include sophisticated track and hold sampling circuitry, analog-to-digital conversion circuitry, high speed memory, and the like. However, traditional track and hold sampling and analog-to-digital circuitry require large investments of time and capital to effectively build and deploy.

Other approaches have involved the use of mixer technology in front of a digitizer platform to allow the system to have wider bandwidth, and a lower cost in development effort, compared to a standard digitizer platform architecture. In U.S. Patent Application Publication 2004/0128076 to Pupalaikis, et al., a real-time oscilloscope is disclosed with an increased usable bandwidth. The real-time oscilloscope splits the input signal into multiple split signals. One split signal is digitized. Simultaneously, the other split signals are frequency shifted to a baseband frequency range and digitized. The digitized frequency-shifted signals are frequency shifted to their original frequency range and then combined with the other digitized signals to create a representation of the input signal. By frequency shifting sub-bands of the input signal to be within the bandwidth of their respective digitizers, an input signal having a frequency range larger than the input bandwidth of a digitizer may be acquired using the lower bandwidth digitizers.

However, a need remains for a multi-band overlay apparatus and method that allows for arbitrary mixer local oscillator coefficients having an inverse matrix relationship to local oscillator coefficients used in the reconstruction of an input signal. In addition, it would be desirable to simultaneously digitize two wide band input signals using four digitizers of narrower bandwidth in a particular arrangement that provides for the use of arbitrary coefficients and an efficient reconstruction algorithm.

DETAILED DESCRIPTION

Embodiments of the invention disclosed herein provide a multi-band overlay mixer apparatus and reconstruction section for increasing the acquisition bandwidth of a test and measurement instrument. The concepts and embodiments disclosed herein can be implemented within a variety of test and measurement instruments such as a digital oscilloscope, a spectrum analyzer, a vector analyzer, a mixed-domain oscilloscope (MDO), or any other suitable test and measurement device.

Figure 1:
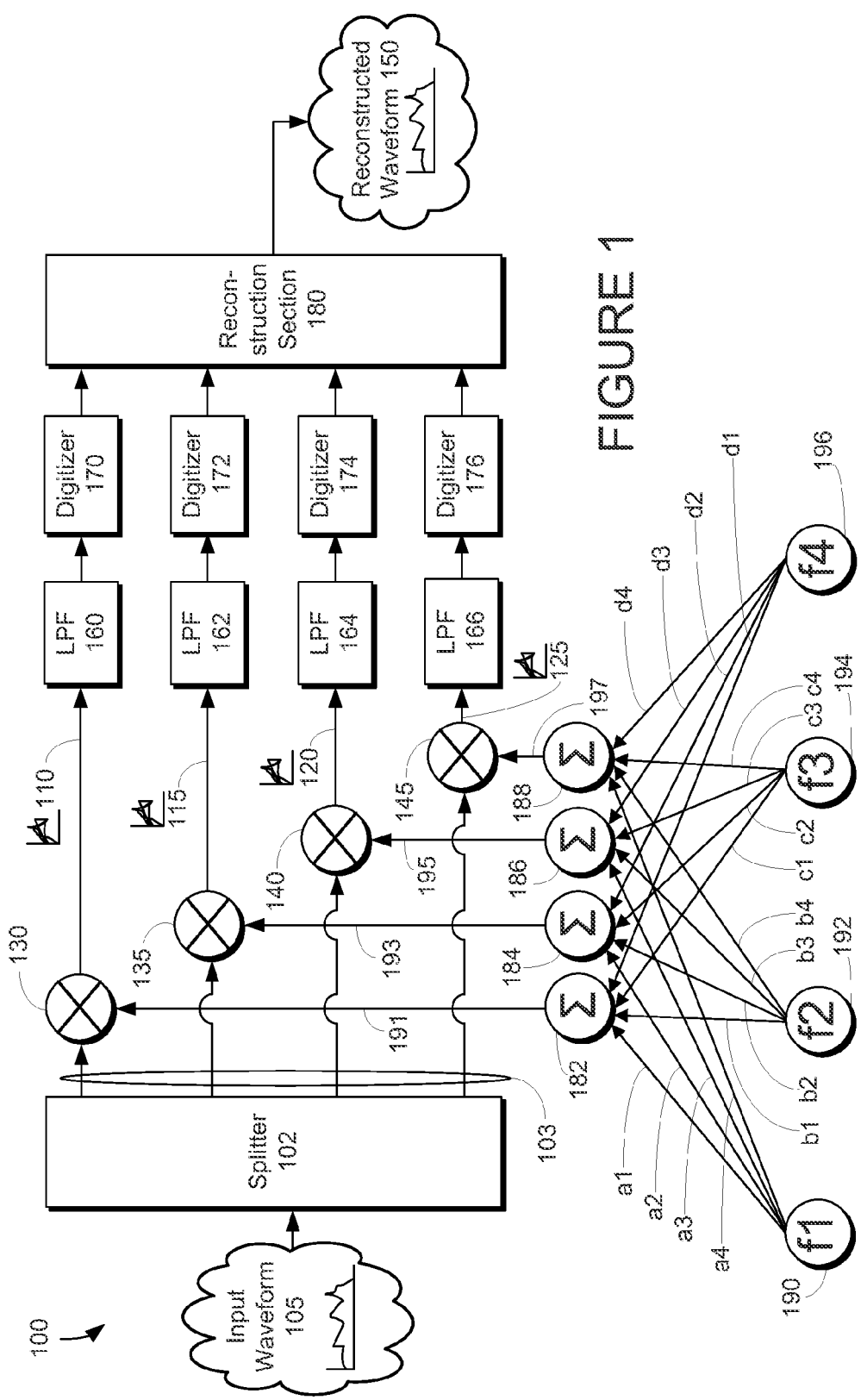
FIG. 1 illustrates a flow diagram including various components of a multi-band overlay mixer apparatus associated with an acquisition apparatus of a test and measurement instrument according to an example embodiment of the present invention.

FIG. 1 illustrates a flow diagram including various components of a multi-band overlay mixer apparatus 100 associated with an acquisition apparatus of a test and measurement instrument according to an example embodiment of the present invention.

The splitter 102 receives a wide band RF input signal 105. The splitter can be a variety of splitters. In one example, the splitter 20 is a resistive power divider. The splitter splits the input signal 105 into multiple split signals among multiple paths 103, such that the spectrums of the split signals are substantially identical. Substantially identical includes variations caused by component variations. For example, a splitter may be designed to produce identical split signals; however, each split signal can be slightly different. Such split signals are still considered substantially identical.

It will be understood that while the number of paths 103 is illustrated as four, any number of paths can be used. All frequencies associated with each of the split signals, including DC at 0 Hz, can be fed to a corresponding mixer (e.g., 130, 135, 140, and 145), which produces frequency translated signals (e.g., 110, 115, 120, and 125). The output of each mixer is fed to the input of a corresponding low-pass filter (e.g., 160, 162, 164, and 166) and/or digitizer (e.g., 170, 172, 174, and 176). A reconstruction section 180 receives the digitized signals, processes the digitized signals, substantially reconstructs the original input signal, and outputs a reconstructed waveform 150.

The apparatus 100 includes oscillators (e.g., 190, 192, 194, and 196) with associated functions (e.g., f1, f2, f3, and f4). Each oscillator generates oscillating signals based on coefficients. For example, oscillator function f1 generates oscillating signals based on coefficients a1, a2, a3, and a4. Similarly, oscillator function f2 generates oscillating signals based on coefficients b1, b2, b3, and b4. Oscillator function f3 generates oscillating signals based on coefficients c1, c2, c3, and c4. And oscillator function f4 generates oscillating signals based on coefficients d1, d2, d3, and d4.

The a, b, c, and d coefficients can be chosen arbitrarily provided that the determinant of a matrix of the coefficients is non-zero. In other words:

$$\begin{vmatrix} a1 & b1 & c1 & d1 \\ a2 & b2 & c2 & d2 \\ a3 & b3 & c3 & d3 \\ a4 & b4 & c4 & d4 \end{vmatrix} \neq 0$$

Generally, oscillator function f1=1 in order to mix in the low band that includes DC. Oscillator function f2=sin($\omega_2$t), where $\omega_2$ represents frequency of the oscillator 192 and t represents time. Oscillator function f3=sin($\omega_3$t), where $\omega_3$ represents frequency of the oscillator 194 and t represents time. Oscillator function f4=sin($\omega_4$t), where $\omega_4$ represents frequency of the oscillator 196 and t represents time. It will be understood that these are exemplary functions and other configurations for the oscillator functions can be used.

Each of the oscillators is coupled to each of summers 182, 184, 186, and 188. Each summer is configured to sum an associated plurality of the oscillating signals. For example, summer 182 receives and sums an oscillating signal based on coefficient a1 from oscillator 190, an oscillating signal based on coefficient b1 from oscillator 192, an oscillating signal based on coefficient c1 from oscillator 194, and an oscillating signal based on coefficient d1 from oscillator 196.

Similarly, summer 184 receives and sums an oscillating signal based on coefficient a2 from oscillator 190, an oscillating signal based on coefficient b2 from oscillator 192, an oscillating signal based on coefficient c2 from oscillator 194, and an oscillating signal based on coefficient d2 from oscillator 196. Summer 186 receives and sums an oscillating signal based on coefficient a3 from oscillator 190, an oscillating signal based on coefficient b3 from oscillator 192, an oscillating signal based on coefficient c3 from oscillator 194, and an oscillating signal based on coefficient d3 from oscillator 196. And summer 188 receives and sums an oscillating signal based on coefficient a4 from oscillator 190, an oscillating signal based on coefficient b4 from oscillator 192, an oscillating signal based on coefficient c4 from oscillator 194, and an oscillating signal based on coefficient d4 from oscillator 196.

In other words, each oscillating signal is weighted by a coefficient, which can be a mathematical complex number, mathematical real number, and/or zero, before it is summed by the corresponding summer. The coefficients can represent phase and/or magnitude of the associated oscillator function. The coefficient weighting may be performed by filter circuits. Moreover, the coefficients can be controlled using multiple parameters circuit components such as transmission line length, attenuators, amplifiers, and the like. For instance, any circuit that modifies phase and amplitude can be used as a filter and can apply the coefficients to the associated oscillating signals.

Each summer is configured to sum the associated oscillating signals into an associated combined signal (e.g., 191, 193, 195, and 197). The mixers (e.g., 130, 135, 140, and 145) are configured to mix an associated split signal (e.g., 130) with the associated combined signal to produce frequency translated signals (e.g., 110, 115, 120, and 125). In other words, the local oscillator (LO) of each mixer includes a sum of multiple oscillators. The mixers and associated functions can be implemented using hardware components such as oscillators, power combiners, filters, frequency multipliers, frequency dividers, directional couplers, or the like.

Frequency translated means that one or more frequency bands of the signal are frequency shifted to a lower bandwidth than the RF input signal. Each mixer output is band limited to remove unwanted images and prevent aliasing using associated filters 160, 162, 164, and 166 prior to digitizing. The frequency translated signals are then digitized using associated digitizers 170, 172, 174, and 176. The digitizers sample the associated waveform and can store the waveform in any suitable memory. The reconstruction section 180 processes the digitized signals to reconstruct the wide band input signal.

Figure 2:
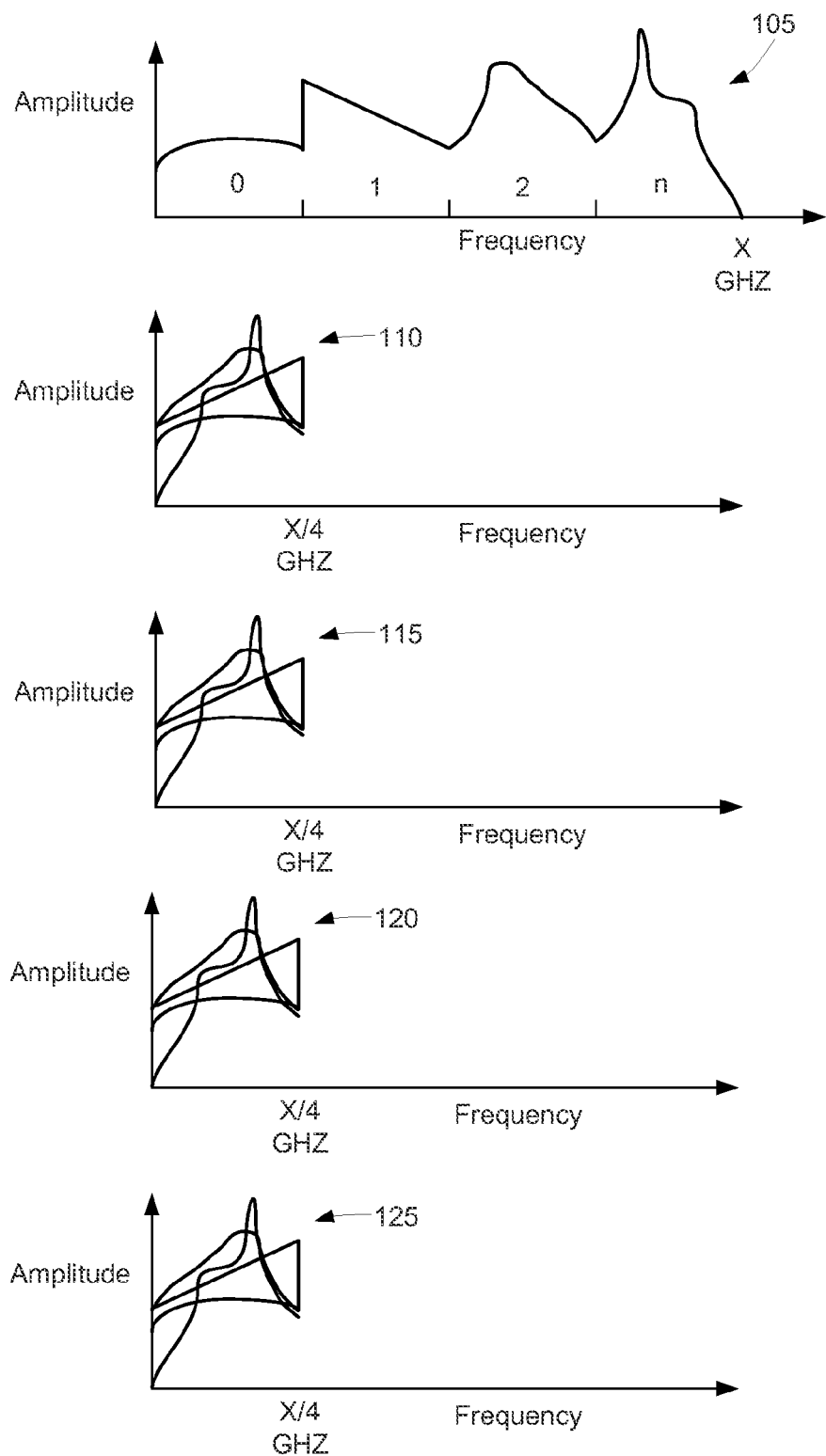
FIG. 2 illustrates an example input signal of FIG. 1 and its associated mixed signals, which have frequency shifted bands of lower bandwidth than the input signal.

FIG. 2 illustrates an example input signal 105 of FIG. 1 and its associated mixed signals 110, 115, 120, and 125, which have frequency shifted bands of lower bandwidth than the input signal 105. Reference is now made to FIGS. 1 and 2.

As explained above, the input signal 105 is split into multiple paths 103, each of which includes a frequency translator (i.e., mixer) having a multi-tone mixing function applied as the LO of the mixer to produce an output comprising a sum of frequency shifted bands of lower bandwidth than the RF input signal 105. For example, as shown in FIG. 2, input signal 105 includes sub-bands 0, 1, 2, and n. Although different shapes of the spectrums of the sub-bands 0, 1, 2, and n have been illustrated, the spectrum can take any shape according to the input signal 105. Each of the split signals is fed to a mixer, which frequency-shifts sub-bands 1, 2, and n so that they overlay sub-band 0. One or more of the sub-bands may be reflected about a given frequency and shifted down in frequency into a mirrored sub-band. Additional details of the various methods for frequency shifting and processing the different sub-bands are set forth in commonly owned U.S. Pat. No. 7,257,497 and commonly owned U.S. Pat. No. 7,474,972, both of which are incorporated herein in their entirety by reference. After each sub-band 1, 2, and n is frequency shifted down to a bandwidth that is at or below the bandwidth of sub-band 0, it can be accurately digitized without the bandwidth limitations of the digitizers having a detrimental effect.

It will be understood that the illustration shown in FIG. 2 is a simplification of this portion of the process, which is more fully described in U.S. Pat. No. 7,474,972, incorporated by reference above. For example, without additional low-pass filters located at the input or in each path to prevent extra images from occurring, extra images or overlaid bands can result, which can then be removed during reconstruction of the signal. Alternatively, a low-pass filter can be disposed at the input of the channel to prevent extra images from entering the channel. In some embodiments, additional low-pass filters can be disposed in each path to prevent the extra images from occurring.

Preferably, the number of paths 130 is equal to the number of the sub-bands that are to be overlaid. The number of paths can also determine the number and relationship of other components. More specifically, the splitter 102 is configured to split the input signal 105 into N split signals among N number of paths. Each path includes a corresponding mixer, or in other words, there can be N mixers. There can be N corresponding summers. Each of the N mixers can be coupled to a corresponding one of the N summers. In some embodiments, there are N oscillators, and each of the N oscillators can be coupled to each of the N summers.

Each oscillator can be configured to produce N oscillating signals based on a plurality of N coefficients. Each of the N summers can be configured to receive and sum N oscillating signals from the N oscillators and produce an associated combined signal. Each of the N mixers can be configured to receive the associated combined signal and mix the combined signal with a corresponding one of the N split signals to produce an associated frequency translated signal.

It will be understood that while the number of paths can be equal to the number of the sub-bands that are to be overlaid, this need not be the case. In some embodiments, different paths may be configured to have a different number of sub-bands overlaid.

Although not shown, an overall low-pass filter can be disposed before the splitter 102 to filter the input signal 105 prior to splitting the input signal into multiple paths.

Figure 3:
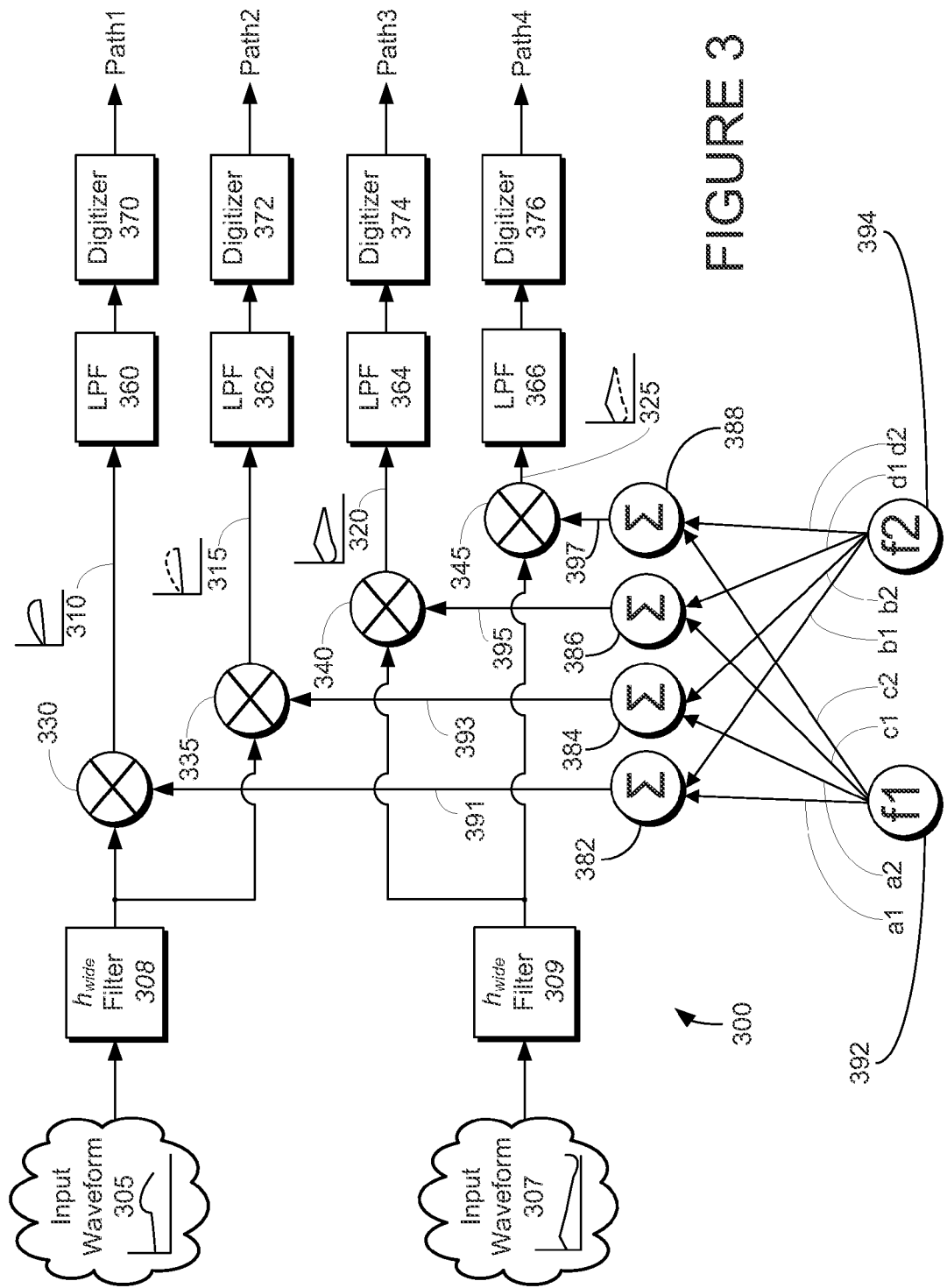
FIG. 3 illustrates a flow diagram including various components of a multi-band overlay mixer apparatus associated with an acquisition apparatus of a test and measurement instrument according to another example embodiment of the present invention.
Figure 4:
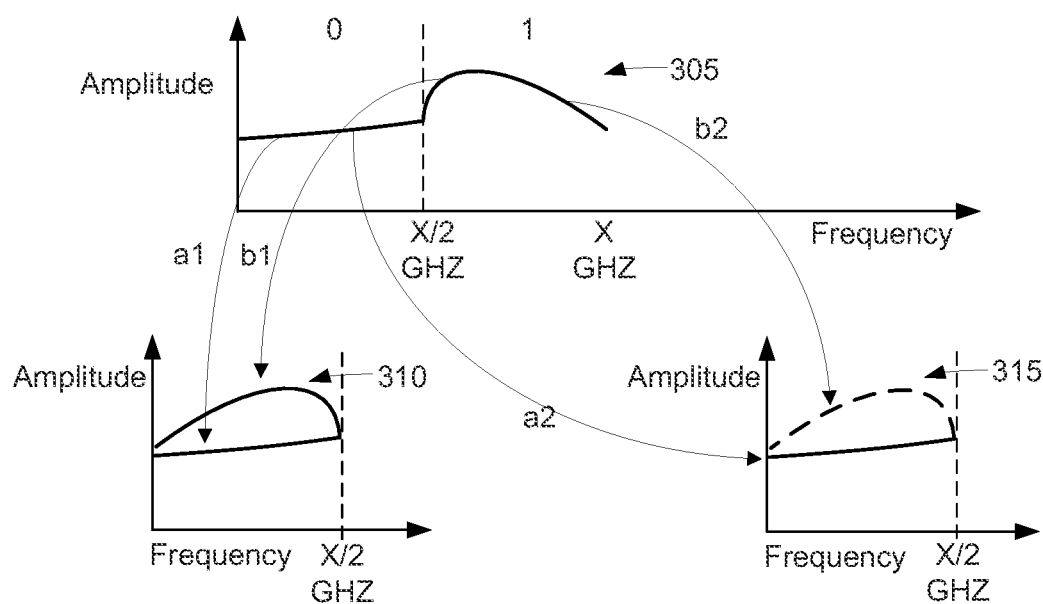
FIG. 4 illustrates an example input signal of FIG. 3 and its associated mixed signals, which have frequency shifted bands of lower bandwidth than the input signal.
Figure 5:
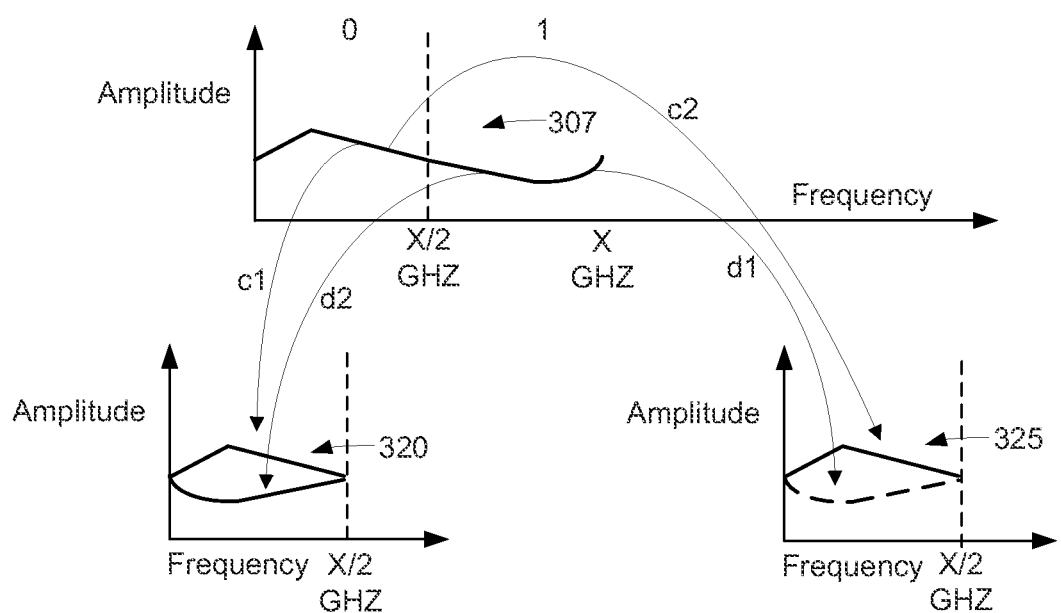
FIG. 5 illustrates another example input signal of FIG. 3 and its associated mixed signals, which have frequency shifted bands of lower bandwidth than the input signal.

FIG. 3 illustrates a flow diagram including various components of a multi-band overlay mixer apparatus 300 associated with an acquisition apparatus of a test and measurement instrument according to another example embodiment of the present invention. While certain components such as the splitter and reconstruction section are not shown in FIG. 3, it will be understood that this example embodiment can be used in combination with other components as disclosed herein. FIG. 4 illustrates the example input signal 305 of FIG. 3 and its associated mixed signals, which have frequency shifted bands of lower bandwidth than the input signal. FIG. 5 illustrates another example input signal 307 of FIG. 3 and its associated mixed signals, which have frequency shifted bands of lower bandwidth than the input signal. Reference is now made to FIGS. 3, 4, and 5.

In this example embodiment, two wide band input signals (e.g., 305 and 307) are received and processed. Each of the wide band input signals are transmitted along two digitizer paths. In other words, input signal 305 is transmitted along digitizer paths Path1 and Path2, and input signal 307 is transmitted along digitizer paths Path3 and Path4. In other words, multiple digitizer paths and/or channels are associated with one input signal.

Each digitizer path includes a mixer, a low-pass filter, and a digitizer. For example, digitizer path Path1 includes mixer 330, low-pass filter 360, and digitizer 370. Digitizer path Path2 includes mixer 335, low-pass filter 362, and digitizer 372. Digitizer path Path3 includes mixer 340, low-pass filter 364, and digitizer 374. And digitizer path Path4 includes mixer 345, low-pass filter 366, and digitizer 376. Two digitizer paths are used for each of the input signals.

All frequencies associated with each of the input signals, including DC, can be fed to corresponding two mixers. For example, the input signal 305 is fed to mixers 330 and 335, and the input signal 307 is fed to mixers 340 and 345. The mixers produce frequency translated signals (e.g., 310, 315, 320, and 325). More specifically, for each mixer and digitizer path, a high band is translated or otherwise frequency shifted to a lower frequency band starting at DC so that the higher sub-band overlays the lower sub-band. The output of each mixer can be fed to the input of a corresponding low-pass filter (e.g., 360, 362, 364, and 366) and/or digitizer (e.g., 370, 372, 374, and 376).

The apparatus 300 includes oscillators (e.g., 392 and 394) with associated functions (e.g., f1 and f2). Each oscillator generates oscillating signals based on coefficients. For example, oscillator function f1 generates oscillating signals based on coefficients a1, a2, c1, and c2. Similarly, oscillator function f2 generates oscillating signals based on coefficients b1, b2, d1, and d2. The multi-tone mixing approach for each mixer is different from that of the other mixers associated with the other paths. The coefficients and their relationship to the oscillator functions and local oscillators of the mixers are described in further detail below.

Each of the oscillators is coupled to each of summers 382, 384, 386, and 388. Each summer is configured to sum an associated plurality of the oscillating signals. For example, summer 382 receives and sums an oscillating signal based on coefficient a1 from oscillator 392 and an oscillating signal based on coefficient b1 from oscillator 394. Similarly, summer 384 receives and sums an oscillating signal based on coefficient a2 from oscillator 392 and an oscillating signal based on coefficient b2 from oscillator 394. Summer 386 receives and sums an oscillating signal based on coefficient c1 from oscillator 392 and an oscillating signal based on coefficient d1 from oscillator 394. And summer 388 receives and sums an oscillating signal based on coefficient c2 from oscillator 392 and an oscillating signal based on coefficient d2 from oscillator 394.

In other words, each oscillating signal is weighted by a coefficient, which can be a mathematical complex number, mathematical real number, and/or zero, before it is summed by the corresponding summer. The coefficients can represent phase and/or magnitude of the associated oscillator function. The coefficient weighting may be performed by filter circuits. Moreover, the coefficients can be controlled using multiple parameters circuit components such as transmission line length, attenuators, amplifiers, and the like. For instance, any circuit that modifies phase and amplitude can be used as a filter and can apply the coefficients to the associated oscillating signals.

Each summer is configured to sum the associated oscillating signals into an associated combined signal (e.g., 391, 393, 395, and 397). For example, the summer 382 generates the combined signal 391, the summer 384 generates the combined signal 393, the summer 386 generates the combined signal 395, and the summer 388 generates the combined signal 397.

The mixers (e.g., 330, 335, 340, and 345) are configured to mix an associated input signal (e.g., 305, 307) with the associated combined signal to produce frequency translated signals (e.g., 310, 315, 320, and 325). In other words, the local oscillator (LO) of each mixer includes a sum of multiple oscillators. Preferably, the number of digitizer paths is equal to the number of mixers, which is equal to the number of terms in the mixing function. The mixers and associated functions can be implemented using hardware components such as oscillators, power combiners, filters, frequency multipliers, frequency dividers, directional couplers, or the like.

More specifically, the mixer 330 is configured to mix the input signal 305 with the combined signal 391 to produce a frequency translated signal 310. The mixer 335 is configured to mix the input signal 305 with the combined signal 393 to produce a frequency translated signal 315. The mixer 340 is configured to mix the input signal 307 with the combined signal 395 to produce a frequency translated signal 320. The mixer 345 is configured to mix the input signal 307 with the combined signal 397 to produce a frequency translated signal 325. The summer 382 is coupled to the mixer 330. The summer 384 is coupled to the mixer 335. The summer 386 is coupled to the mixer 340. The summer 388 is coupled to the mixer 345.

As illustrated in FIGS. 4 and 5, the wide band input signals 305 and 307 are frequency shifted so that a high band overlays a low band of the associated input signal. Although different shapes of the spectrums of the sub-bands 0 and 1 have been illustrated, the spectrum can take any shape according to the input signal 305 and/or 307. The coefficients a1, a2, b1, and b2 ultimately affect how the input signal 305 is mixed down into frequency translated signals 310 and 315. Similarly, the coefficients c1, c2, d1, and d2 ultimately affect how the input signal 307 is mixed down into frequency translated signals 320 and 325. For instance, not only can a sub-band be frequency shifted to a lower frequency band, but the phase can also be different, as denoted by the dashed lines. Moreover, where the wide band signal occupied a bandwidth range of X GHz, the frequency translated signals occupy a bandwidth range of X/2 GHz or thereabout. It will be understood that two or more sub-bands can be frequency shifted to a lower band, particularly when there are two or more digitizer paths.

Each mixer output can be band limited to remove unwanted images and prevent aliasing using associated filters 360, 362, 364, and 366 prior to digitizing. The frequency translated signals can then be digitized using associated digitizers 370, 372, 374, and 376. The digitizers sample the associated waveform and can store the waveform in any suitable memory. Preferably, the digitizers receive signals that have a minimum of two frequency bands (i.e., a low band and a high band) taken from the wide band input signal and summed together, as described above. Preferably, the bandwidths of each of the bands are approximately equal, and slightly lower than the bandwidth of a digitizer path.

The oscillator function f2 coefficients of b1, b2, d1, and d2 may be represented as mathematical complex numbers, which can be multiplied by or otherwise weighted against the associated sine function. The coefficients can represent the phase and/or magnitude of the oscillator, which can determine the combined signal as applied to the LO input of the mixer. The combined signals fed to the LO input of the mixers need not be split into separate real and imaginary signal components, but rather, are generally a sum of mathematical real only signals from multiple signal sources (f1, f2, and so forth). Since f1 is preferably a DC value, it can be represented with mathematical real coefficients (e.g., a1, a2, c1, and c2). However, if the coefficients are represented as mathematical complex numbers, the equations are nevertheless solvable.

The wide band input signals (e.g., 305 and 307) can be band limited by filters $h_{wide}$ 308 and 309. Where the wide band input signal 305 is represented by x1 and the wide band input signal 307 is represented by x2, the signals can be filtered as followed:

$$\begin{bmatrix} x1 \\ x2 \end{bmatrix} := \begin{bmatrix} x1 * h_{wide} \\ x2 * h_{wide} \end{bmatrix},$$

where ':=' is an assignment operator. In other words, x1 becomes $x1*h_{wide}$ and, similarly, x2 becomes $x2*h_{wide}$.

Generally, oscillator function f1=1 in order to mix in the low band that includes DC. Oscillator function $f2=\sin(2\pi ft)$, where f represents frequency of a periodic signal and t represents time. Preferably, the oscillator function f2 is equal to a mixer high side oscillator at approximately the frequency of the bandwidth of the filters $h_{wide}$ 308 and 309. It will be understood that these are exemplary functions and other configurations for the oscillator functions can be used.

Where the combined signal 391 corresponds to local oscillator LO1 for mixer 330, the combined signal 393 corresponds to local oscillator LO2 for mixer 335, the combined signal 395 corresponds to local oscillator LO3 for mixer 340, and the combined signal 397 corresponds to local oscillator LO4 for mixer 345, the local oscillators can be determined based on the coefficients and oscillator functions as follows:

$$\begin{bmatrix} LO1 \\ LO2 \end{bmatrix} = \begin{bmatrix} a1 & b1 \\ a2 & b2 \end{bmatrix} \cdot \begin{bmatrix} f1 \\ f2 \end{bmatrix}; \text{ and}$$

$$\begin{bmatrix} LO3 \\ LO4 \end{bmatrix} = \begin{bmatrix} c1 & d1 \\ c2 & d2 \end{bmatrix} \cdot \begin{bmatrix} f1 \\ f2 \end{bmatrix}$$

The a, b, c, and d coefficients can be chosen arbitrarily provided that the determinant of a matrix of the coefficients is non-zero so that the equations used to determine the LO input of the mixers are linearly independent. In other words, provided that:

$$\begin{vmatrix} a1 & b1 \\ a2 & b2 \end{vmatrix} \neq 0; \text{ and } \begin{vmatrix} c1 & d1 \\ c2 & d2 \end{vmatrix} \neq 0.$$

Preferably, the mixers 330, 335, 340, and 345 are designed to handle DC. In such manner, the combined signals (e.g., 391, 393, 395, and 397) can be determined based on an oscillating signal generated by f1 and an oscillating signal generated by f2, which results in the summation of a high band and a low band at the output of the corresponding mixer.

Alternatively, if a mixer that handles DC input is not available, the high frequency band only can be fed through a mixer to be mixed down to occupy approximately the same band as the lower frequency band. Then, the two sub paths can be summed together with a power combiner, bandwidth limited, and then applied to a digitizer.

In some embodiments, the digitizers (e.g., 370, 372, 374, and 376) can digitize the frequency translated signals (e.g., 310, 315, 320, and 325) prior to filtering by the low-pass filters (e.g., 360, 362, 364, 366). For example, where the input signal 305 corresponds to x1, the input signal 307 corresponds to x2, the signal 310 corresponds to s1, the signal 315 corresponds to s2, the signal 320 corresponds to s3, and the signal 325 corresponds to s4, the signals s1, s2, s3, and s4 can be determined as follows:

$$\begin{bmatrix} s1 \\ s2 \end{bmatrix} = \begin{bmatrix} a1 & b1 \\ a2 & b2 \end{bmatrix} \cdot \begin{bmatrix} f1 \\ f2 \end{bmatrix} \cdot x1; \text{ and } \begin{bmatrix} s3 \\ s4 \end{bmatrix} = \begin{bmatrix} c1 & d1 \\ c2 & d2 \end{bmatrix} \cdot \begin{bmatrix} f1 \\ f2 \end{bmatrix} \cdot x2$$

A low-pass filter can then be applied to frequency translated signals s1, s2, s3, and s4, as follows:

$$\begin{bmatrix} p1 \\ p2 \end{bmatrix} := \begin{bmatrix} s1 * hlp \\ s2 * hlp \end{bmatrix}; \text{ and}$$

$$\begin{bmatrix} p3 \\ p4 \end{bmatrix} := \begin{bmatrix} s3 * hlp \\ s4 * hlp \end{bmatrix}$$

where hlp corresponds to one of the low-pass filters 360, 362, 364, and/or 366, and where ':=' is an assignment operator. In other words, p1 becomes s1*hlp and, similarly, p2 becomes s2*hlp. In addition, p3 becomes s3*hlp and p4 becomes s4*hlp. It will be understood that the filtering can occur prior to the digitizing, and/or vice versa. The digitized values p1, p2, p3, and p4, correspond to the signals transmitted along Path1, Path2, Path3, and Path4, respectively.

Figure 6:
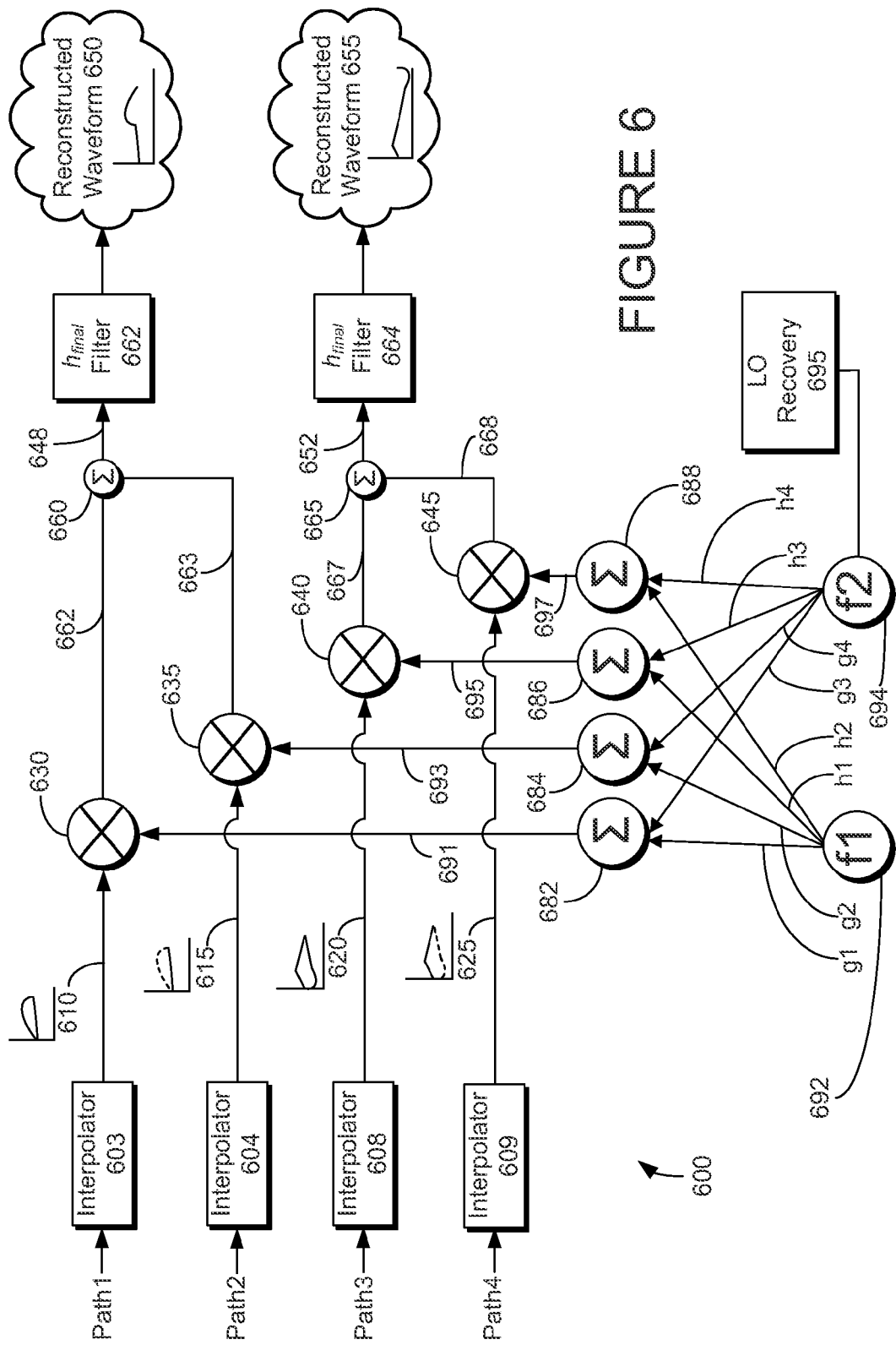
FIG. 6 illustrates a reconstruction section according to an example embodiment of the present invention.

FIG. 6 illustrates a reconstruction section 600 according to an example embodiment of the present invention. The reconstruction section 600 includes interpolators (e.g., 603, 604, 608, and 609), each interpolator associated with a corresponding one of the first, second, third, and fourth digitizer paths (e.g., Path1, Path2, Path3, and Path4), respectively. The interpolators can interpolate an associated frequency translated signal (e.g., 310, 315, 320, and 325 of FIG. 3), and produce interpolated signals (e.g., 610, 615, 620, and 625). Each of the digitized frequency translated signals received over Path1, Path2, Path3, and Path4 can be interpolated by a factor that is equal to the number of paths, or in other words, by a factor that is equal to the number of split input signals, which in this example is four. Each of the mixers (e.g., 630, 635, 640, and 645) of the reconstruction section is associated with a corresponding one of the digitizer paths (e.g., Path1, Path2, Path3, and Path4). The mixers can mix an associated frequency translated signal with an associated recombination signal (e.g., 691, 693, 695, and 697).

The reconstruction section 600 further includes summers (e.g., 682, 684, 686, and 688). Each summer is coupled to a corresponding one of the mixers. For example, summer 682 is coupled to mixer 630, summer 684 is coupled to mixer 635, summer 686 is coupled to mixer 640, and summer 688 is coupled to mixer 645.

The reconstruction section 600 further includes oscillators 692 and 694. Each of the oscillators 692 and 694 is coupled to each of the summers 682, 684, 686, and 688. The summer 682 is configured to sum an oscillating signal based on coefficient g1 from the oscillator 692 with an oscillating signal based on coefficient g3 from the oscillator 694 to produce the recombination signal 691. The summer 684 is configured to sum an oscillating signal based on coefficient g2 from the oscillator 692 with an oscillating signal based on coefficient g4 from the oscillator 694 to produce the recombination signal 693. The summer 686 is configured to sum an oscillating signal based on coefficient h1 from the oscillator 692 with an oscillating signal based on coefficient h3 from the oscillator 694 to produce the recombination signal 695. The summer 688 is configured to sum an oscillating signal based on coefficient h2 from the oscillator 692 with an oscillating signal based on coefficient h4 from the oscillator 694 to produce the recombination signal 697.

The coefficients g1, g2, g3, g4 and h1, h2, h3, h4 are determined based on an inverse matrix relationship with the coefficients a1, a2, b1, b2 and c1, c2, d1, d2 discussed above. More specifically:

$$\begin{bmatrix} g1 & g3 \\ g2 & g4 \end{bmatrix} = \begin{bmatrix} a1 & b1 \\ a2 & b2 \end{bmatrix}^{-1}; \text{ and}$$

$$\begin{bmatrix} h1 & h3 \\ h2 & h4 \end{bmatrix} = \begin{bmatrix} c1 & d1 \\ c2 & d2 \end{bmatrix}^{-1}$$

Another way to represent the inverse matrices are as follows:

$$\begin{bmatrix} a1 & b1 \\ a2 & b2 \end{bmatrix}^{-1} = \begin{bmatrix} \frac{b2}{a1 \cdot b2 - a2 \cdot b1} & \frac{-b1}{a1 \cdot b2 - a2 \cdot b1} \\ \frac{-a2}{a1 \cdot b2 - a2 \cdot b1} & \frac{a1}{a1 \cdot b2 - a2 \cdot b1} \end{bmatrix}; \text{ and}$$

$$\begin{bmatrix} c1 & d1 \\ c2 & d2 \end{bmatrix}^{-1} = \begin{bmatrix} \frac{d2}{c1 \cdot d2 - c2 \cdot d1} & \frac{-d1}{c1 \cdot d2 - c2 \cdot d1} \\ \frac{-c2}{c1 \cdot d2 - c2 \cdot d1} & \frac{c1}{c1 \cdot d2 - c2 \cdot d1} \end{bmatrix}$$

As a result, all frequency bands are restored to their original frequency position. Thus, the signal in each path is not restored to the original split signal of that path.

Observation of the two equations associated with each inverse matrix above helps to point out values of coefficients to avoid. For example, the value of a1·b2−a2·b1 cannot be equal to zero. It would also be desirable to avoid the situation where a1·b2 is approximately equal to a2·b1 since that would result in a value close to zero in the denominator.

Where the recovered signal 648 corresponds to yy1, the recovered signal 652 corresponds yy2, interpolated signal 610 corresponds to Path1, interpolated signal 615 corresponds to Path2, interpolated signal 620 corresponds to Path3, and interpolated signal 625 corresponds to Path4, the following equations can be used:

$$yy1 = \begin{bmatrix} f1 & 4f2 \end{bmatrix} \cdot \begin{bmatrix} a1 & b1 \\ a2 & b2 \end{bmatrix}^{-1} \cdot \begin{bmatrix} Path1 \\ Path2 \end{bmatrix}; \text{ and}$$

$$yy2 = \begin{bmatrix} f1 & 4f2 \end{bmatrix} \cdot \begin{bmatrix} c1 & d1 \\ c2 & d2 \end{bmatrix}^{-1} \cdot \begin{bmatrix} Path3 \\ Path4 \end{bmatrix}$$

where f1 is the oscillator function associated with oscillator 692, and f2 is the oscillator function associated with oscillator 694. The factor of 4 that is multiplied by f2 is to compensate for conversion gain loss of the mixers. For instance, the first hardware mixer splits the signal into two images, and one is filtered out. The same or similar can happen again with a software mixer; thus, a factor of 4 can be used to restore the amplitude.

The recovered signals 648 and 652 can then be filtered using filters 662 and 664, respectively, to apply phase and/or magnitude correction. Where the reconstructed waveform 650 corresponds to y1 and the reconstructed waveform 655 corresponds to y2, the phase and magnitude correction by the $h_{final}$ filters 662 and 664 can be represented as follows:

$$\begin{bmatrix} y1 \\ y2 \end{bmatrix} = \begin{bmatrix} yy1 * h_{final} \\ yy2 * h_{final} \end{bmatrix}$$

The $h_{final}$ filters 662 and 664 can be used to correct the phase and/or magnitude of all frequencies across the entire wide bandwidth of the reconstructed signal. These can also correct the acquisition to acquisition phase variation of the high band due to an asynchronous LO for f2. The signals from the two related paths can be low-pass filtered and summed using a final summing block prior to being fed to the $h_{final}$ filters. For example, signals 662 and 663 can be low-pass filtered and summed using final summing block 660. Similarly, signals 667 and 668 can be low-pass filtered and summed using final summing block 665.

The oscillator function f2 associated with oscillator 694 may be asynchronous with respect to the sample clock of the test and measurement instrument and the trigger position of the acquired waveform. Thus, the LO recovery unit 695 can be used to determine the phase with respect to a time reference point on the acquired waveform, which is preferably the trigger position. Movement of the LO with respect to the waveform can cause all frequencies in the band translated by the mixer to be shifted by a constant phase angle equal to the negative of the LO phase angle shift for high side mixing.

In some embodiments, each of the $h_{final}$ filters 662 and 664 is split into two filter blocks. One filter block can be an allpass type of filter with constant phase delay over the band of frequencies covered by the high band. This filter block can have coefficients change from one acquisition to the next to compensate for the f2 oscillator offset with respect to a time reference point on the input waveform. The second filter block can be a low pass filter, which corrects phase and magnitude errors over the entire bandwidth of the reconstructed signal. This filter block can have constant coefficients from one acquisition to the next. Moreover, these can be calibrated at manufacture time using known techniques. The outputs of the $h_{final}$ filters 662 and 664 correspond to the substantially reconstructed original signals represented by waveforms 650 and 655, respectively.

In addition, an allpass constant time delay correction filter (not shown) can be used to remove phase variation from one acquisition to the next due to the asynchronous sample clock with respect to the acquired waveform trigger position. This filter can be applied to the digitized waveform prior to mixing up for signal reconstruction.

The reference oscillator phase can be recovered and used along with calibration constants to recreate the complex mixing functions of the reconstruction section.

Figure 7:
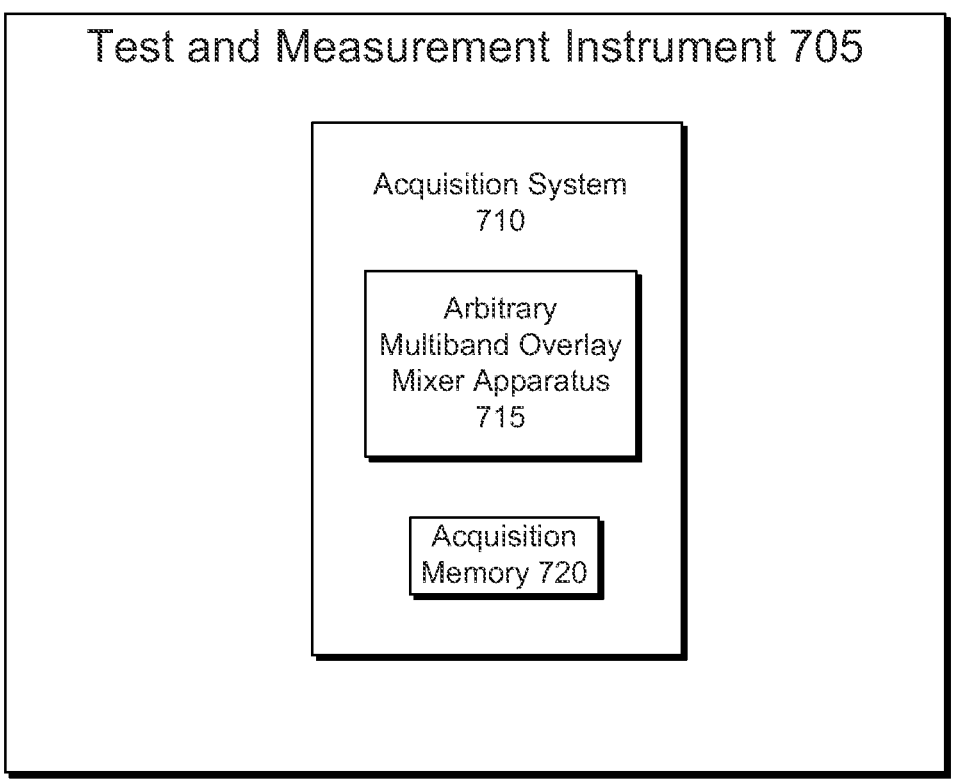
FIG. 7 illustrates a block diagram of a test and measurement instrument, including the multi-band overlay mixer acquisition apparatus according to embodiments of the present invention.

FIG. 7 illustrates a block diagram of a test and measurement instrument 705, including an acquisition system 710. The acquisition system 710 can include acquisition memory 720, and an arbitrary multiband overlay mixer apparatus 715, which can take various forms as discussed in detail above with reference to the various embodiments. It will be understood that any of the components of the arbitrary multiband overlay mixer apparatus 715, including the reconstruction section, can be implemented using hardware, software, firmware, or any combination thereof.

Although particular embodiments have been described, it will be appreciated that the principles of the invention are not limited to those embodiments. For example, the local oscillator generation and recovery can provide a means for determining the phase of the function terms that are applied to each mixer in each path. The determined phase can be used in order to correctly generate the mixing functions needed to reconstruct the original wide band signal from the multiple digitized signals. If these terms are generated from a single reference oscillator then other terms may be synchronized to the reference oscillator and either multiplied or divided in frequency, and then used to build the complex mixing functions. In addition, a split of one or more of the frequencies that fit within the bandwidth of an extra unused digitizer in the system can be acquired, and/or multiple splits of different mixing frequencies that fit in the bandwidth of the digitizer may be used.

Splits of various oscillators used may be fed to additional comparator hardware not shown in the figures, in addition to time interpolator circuit blocks in the digitizer trigger system that are capable of measuring a time from the oscillator zero crossing to the time of the acquired waveform trigger. Reference oscillators may be synchronized to the digitizer sample clock system using hardware, and may be asynchronous to the digitizer sample clock.

A calibration system can be used at manufacture time, which can provide measurement phase and magnitude response of the reconstructed signal. A filter can be computed to correct this response to match a desired target response.

The recovered time delay from a reference time position point on the waveform to the local oscillators can be used to compute an all-pass constant phase correction filter. This filter can have different coefficients from one acquisition to the next if the local oscillators are asynchronous with respect to the reference time position point on the acquired waveform. This filter can be convolved for each acquisition with a calibrated bandwidth enhance filter to make up the final filter.

Some embodiments can include one or more tangible computer-readable media storing computer-executable instructions that, when executed by a processor, operate to perform the methods described herein. Variations and modifications may be made without departing from the principles of the invention as set forth in the following claims.

The invention claimed is:

1. An acquisition apparatus for a test and measurement instrument, comprising:

a first input channel having first and second digitizer paths;
a second input channel having third and fourth digitizer paths;
first and second mixers associated with the first and second digitizer paths, respectively;
third and fourth mixers associated with the third and fourth digitizer paths, respectively;
a plurality of summers, each summer associated with a corresponding one of the first, second, third, and fourth mixers;
a first oscillator coupled to each of the plurality of summers and configured to produce an oscillating signal for each summer based on a first plurality of coefficients; and
a second oscillator coupled to each of the plurality of summers and configured to produce an oscillating signal for each summer based on a second plurality of coefficients.

2. The acquisition apparatus of claim 1, wherein each of the plurality of summers is configured to sum the oscillating signal from the first oscillator with the oscillating signal from the second oscillator.

3. The acquisition apparatus of claim 1, wherein:
the first digitizer path includes a first low-pass filter and a first digitizer;
the second digitizer path includes a second low-pass filter and a second digitizer;
the third digitizer path includes a third low-pass filter and a third digitizer; and
the fourth digitizer path includes a fourth low-pass filter and a fourth digitizer.

4. The acquisition apparatus of claim 1, wherein:
the plurality of summers includes first, second, third, and fourth summers;
the first summer is coupled to the first mixer;
the second summer is coupled to the second mixer;
the third summer is coupled to the third mixer; and
the fourth summer is coupled to the fourth mixer.

5. The acquisition apparatus of claim 4, wherein:
the first summer is configured to sum an oscillating signal based on coefficient a1 from the first oscillator with an oscillating signal based on coefficient b1 from the second oscillator to produce a first combined signal;
the second summer is configured to sum an oscillating signal based on coefficient a2 from the first oscillator with an oscillating signal based on coefficient b2 from the second oscillator to produce a second combined signal;
the third summer is configured to sum an oscillating signal based on coefficient c1 from the first oscillator with an oscillating signal based on coefficient d1 from the second oscillator to produce a third combined signal;
the fourth summer is configured to sum an oscillating signal based on coefficient c2 from the first oscillator with an oscillating signal based on coefficient d2 from the second oscillator to produce a fourth combined signal;
and wherein:

$$\begin{vmatrix} a1 & b1 \\ a2 & b2 \end{vmatrix} \neq 0; \text{ and } \begin{vmatrix} c1 & d1 \\ c2 & d2 \end{vmatrix} \neq 0.$$

6. The acquisition apparatus of claim 5, wherein:
the first mixer is configured to mix a first input signal with the first combined signal to produce a first frequency translated signal;

the second mixer is configured to mix the first input signal with the second combined signal to produce a second frequency translated signal;

the third mixer is configured to mix a second input signal with the third combined signal to produce a third frequency translated signal; and the fourth mixer is configured to mix the second input signal with the fourth combined signal to produce a fourth frequency translated signal.

7. The acquisition apparatus of claim 1, further comprising a reconstruction section including:

a plurality of interpolators, each interpolator associated with a corresponding one of the first, second, third, and fourth digitizer paths, and configured to interpolate one of first, second, third, and fourth frequency translated signals, respectively; and a plurality of mixers, each mixer associated with one of the first, second, third, and fourth digitizer paths, and configured to mix one of the first, second, third, and fourth frequency translated signals with one of first, second, third, and fourth recombination signals, respectively.

8. The acquisition apparatus of claim 7, wherein the reconstruction section further includes first, second, third, and fourth summers, each summer coupled to a corresponding one of the plurality of mixers.

9. The acquisition apparatus of claim 8, wherein the reconstruction section further includes first and second oscillators, each oscillator coupled to each of the summers of the reconstruction section.

10. The acquisition apparatus of claim 9, wherein:

the first summer of the reconstruction section is configured to sum an oscillating signal based on coefficient g1 from the first oscillator with an oscillating signal based on coefficient g3 from the second oscillator to produce the first recombination signal;

the second summer of the reconstruction section is configured to sum an oscillating signal based on coefficient g2 from the first oscillator with an oscillating signal based on coefficient g4 from the second oscillator to produce the second recombination signal;

the third summer of the reconstruction section is configured to sum an oscillating signal based on coefficient h1 from the first oscillator with an oscillating signal based on coefficient h3 from the second oscillator to produce the third recombination signal;

the fourth summer of the reconstruction section is configured to sum an oscillating signal based on coefficient h2 from the first oscillator with an oscillating signal based on coefficient h4 from the second oscillator to produce the fourth recombination signal;

wherein:

$$\begin{bmatrix} g1 & g3 \\ g2 & g4 \end{bmatrix} = \begin{bmatrix} a1 & b1 \\ a2 & b2 \end{bmatrix}^{-1};$$
$$\begin{bmatrix} h1 & h3 \\ h2 & h4 \end{bmatrix} = \begin{bmatrix} c1 & d1 \\ c2 & d2 \end{bmatrix}^{-1}$$

and wherein a1, a2, c1, and c2 correspond to the first plurality of coefficients, and b1, b2, d1, and d2 correspond to the second plurality of coefficients.

* * * * *